(12) United States Patent
Ellis

(10) Patent No.: US 6,421,280 B1
(45) Date of Patent: Jul. 16, 2002

(54) METHOD AND CIRCUIT FOR LOADING DATA AND READING DATA

(75) Inventor: Robert M. Ellis, Hemlock, OR (US)

(73) Assignee: Intel Corporation, Santa Clara, CA (US)

(*) Notice: Subject to any disclaimer, the term of this patent is extended or adjusted under 35 U.S.C. 154(b) by 2 days.

(21) Appl. No.: 09/583,951

(22) Filed: May 31, 2000

(51) Int. Cl.[7] .................................................. G11C 8/00
(52) U.S. Cl. .............. 365/189.05; 365/233; 365/233.08
(58) Field of Search ........................... 365/189.05, 233, 365/230.08

(56) References Cited

U.S. PATENT DOCUMENTS

| | | | | |
|---|---|---|---|---|
| 5,218,686 A | * | 6/1993 | Thayer | 395/425 |
| 5,402,389 A | * | 3/1995 | Flannagan et al. | 365/240 |
| 5,805,518 A | * | 9/1998 | Hashinmoto et al. | 365/221 |
| 5,898,895 A | * | 4/1999 | Williams | 395/880 |
| 5,901,100 A | * | 5/1999 | Taylor | 365/219 |
| 5,978,891 A | * | 11/1999 | Takeda | 711/167 |
| 6,088,743 A | * | 7/2000 | Takeda | 710/52 |
| 6,108,755 A | * | 8/2000 | Kabemoto et al. | 711/147 |
| 6,292,419 B2 | * | 9/2001 | Tsuda | 365/221 |

* cited by examiner

Primary Examiner—Richard Elms
Assistant Examiner—Tuan T. Nguyen
(74) Attorney, Agent, or Firm—Antonelli, Terry, Stout & Kraus, LLP

(57) ABSTRACT

A method and circuit are provided for asynchronously loading data in a first data buffer and a second data buffer and synchronously reading the data from the first data buffer and the second data buffer. A load data circuit may receive a plurality of input signals and output a first latch enable signal and a second latch enable signal. The load data circuit may asynchronously operate based on the input signals. The first latch enable signal may enable data to be loaded in the first data buffer and the second latch enable signal may enable data to be loaded in the second data buffer. A read data circuit may be coupled to the first data buffer and the second data buffer. The read data circuit may synchronously address the first data buffer and said second data buffer so as to read the data based on a synchronous clock signal.

26 Claims, 8 Drawing Sheets

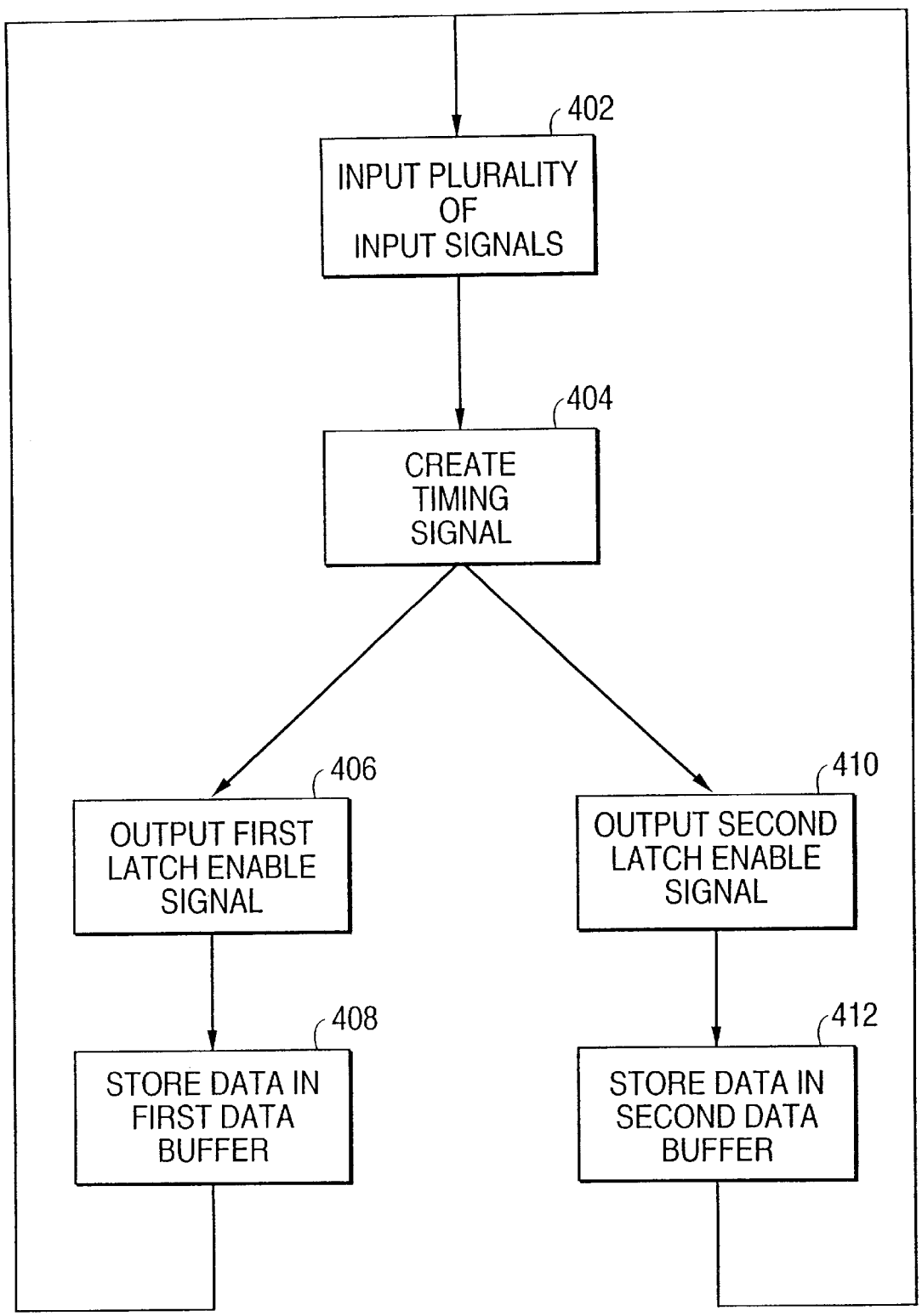

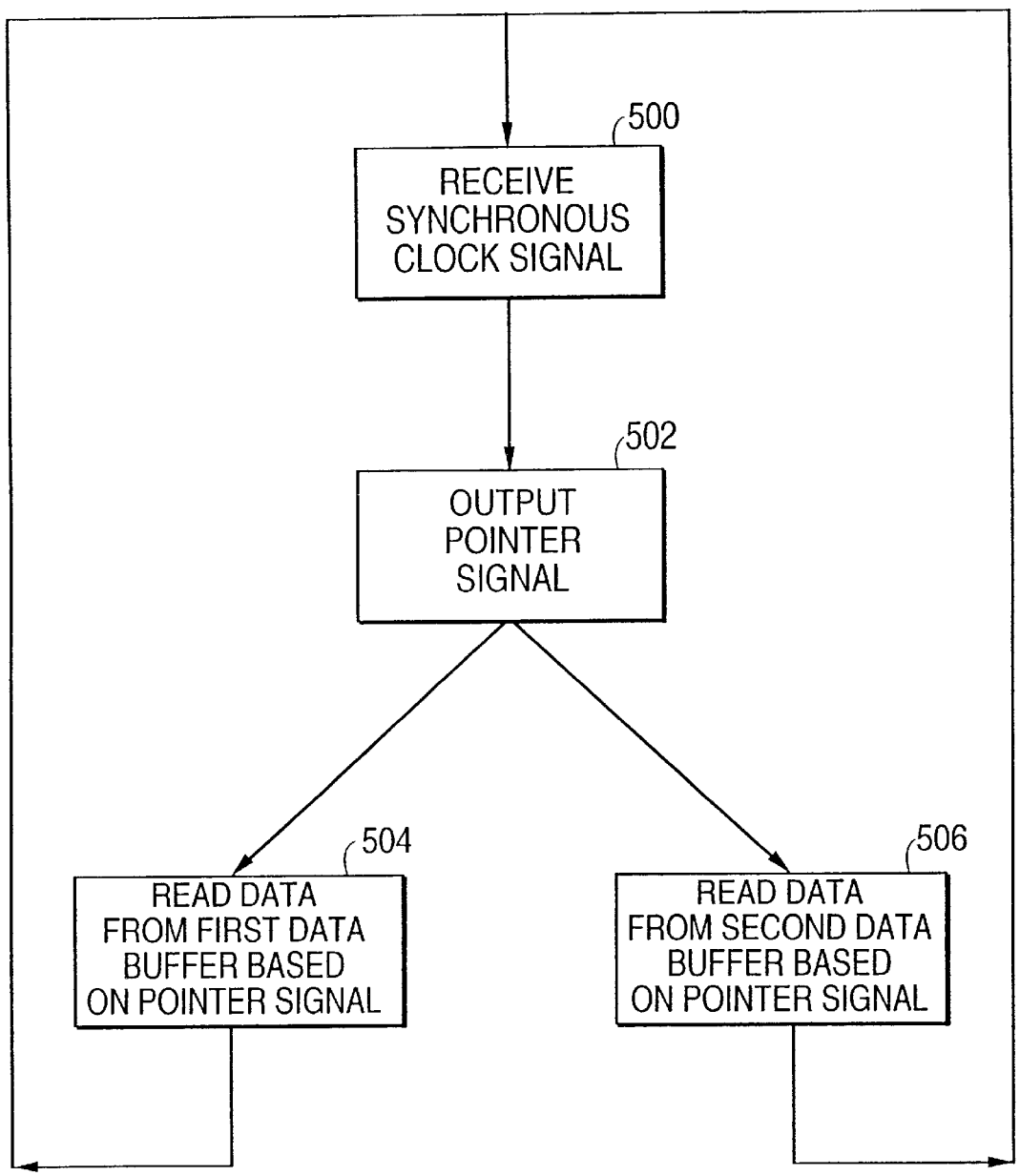

METHOD AND CIRCUIT FOR LOADING DATA AND READING DATA

FIELD

The invention generally relates to the loading and reading of data from a plurality of data buffers and, more particularly, relates to a method and circuit for asynchronously loading a plurality of data buffers and synchronously reading from the plurality of data buffers.

BACKGROUND

High-speed microprocessors require low memory latency and high memory bandwidth to reach maximum processing capability. However, high-speed memory capable of keeping up with the processor is very expensive and therefore an approach of using a combination of expensive high-speed memory and less expensive lower-speed memory may be used. High-speed memory, such as cache memory, contains a subset of the data stored in the lower-speed memory. The processor requests data first from the cache, which supplies the data if the data is contained in the cache (cache hit). If the cache does not contain the data (cache miss), the processor retrieves the data from lower-speed memory and also writes the data to the cache for future requests. Since the number of cycles required to retrieve data from lower-speed memory is an order of magnitude larger than the number of cycles to retrieve data from the cache memory, it is desirable to have a high hit rate.

Cache latency is the number of cycles from when the processor requests data from the cache to the time when the first burst of data from cache memory is delivered to the processor. High processor frequencies force latency cycles to increase to allow the cache enough time to determine if an access is a hit or miss and supply the requested data. Bandwidth is the amount of data that can be transferred to the processor measured in bytes of data per second. Bandwidth is independent of latency; a cache memory bus can have a high latency number and still be completely saturated with data yielding a high data bandwidth.

High latency creates a problem storing data that still needs to be burst out to the processor while a new access needs to store its data. The higher the latency, the more difficult this problem can become. To solve this problem, multiple storage buffers may be used. Data may be kept in storage buffers while waiting to be burst out while a separate storage buffer is loaded with data from a subsequent request.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and is not limited thereto.

The following represents a brief description of the drawings in which like reference numerals represent like elements and wherein:

FIG. 7A is a flowchart showing asynchronous loading of data; and

FIG. 7B is a flowchart showing synchronous reading of data.

DETAILED DESCRIPTION

Figure 1:
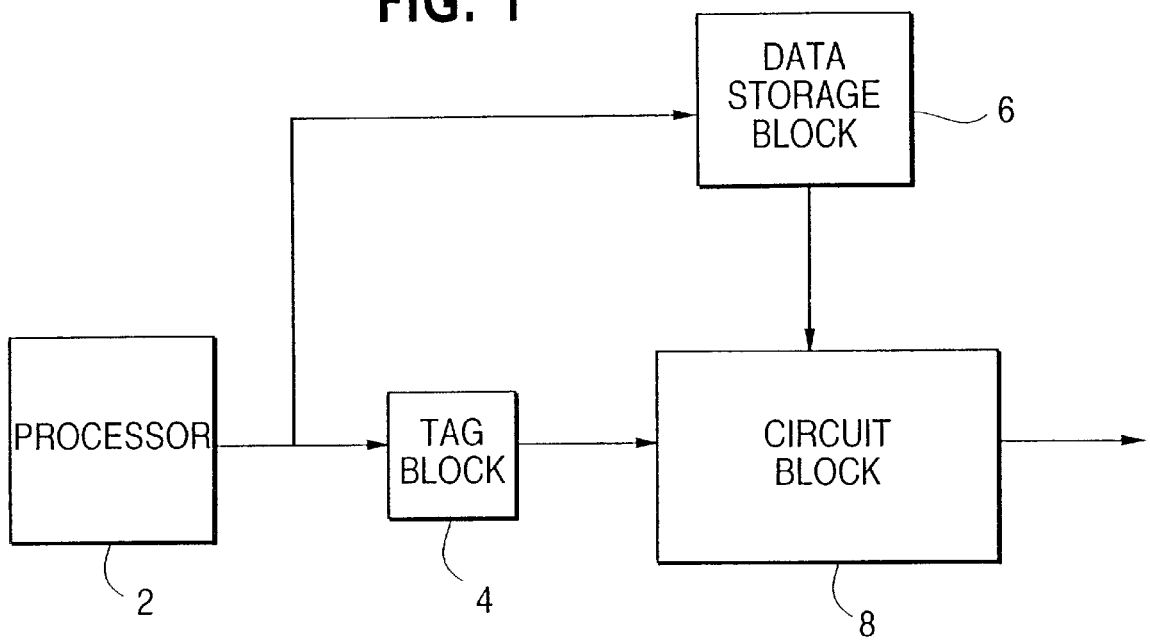
FIG. 1 is a diagram illustrating a processor, data storage unit and circuit block for loading and reading data in accordance with embodiments of the present invention.

Before beginning a detailed description of the subject invention, mention of the following is in order. When appropriate, like reference numerals and characters may be used to designate identical, corresponding or similar components in differing figure drawings. Embodiments of the present invention relate to a circuit design to perform the asynchronous loading of data and additionally to perform the synchronous reading of data. While the present invention will be described with respect to example circuits, the implementation of these circuits may be accomplished in any one of several ways, including but not limited to logic circuits, circuit elements provided within a microchip as well as software implementation of the respective functions. Each of these implementations is within the scope of the present invention. The circuit design(s) may be further provided on any number of machine readable media including but not limited to magnetic disks (fixed, floppy, and removable); other magnetic media such as magnetic tapes; optical media such as CD-ROM disks; via Internet downloads or any other viable method. Further, the circuit designs may have many variations of the circuit components that can perform the various function(s). Each of these variations are within the scope of the present invention. Embodiments of the present invention may also be described with respect to signals being input or output from different circuit components. It is understood that while the discussion identifies a signal, the signal is transmitted over a signal line such as that shown in the drawings. The terminology signal may also correspond to a signal line as shown in the drawings. Additionally, well known power/ground and address connections to ICs and other components may not be shown within the Figures for simplicity of illustration and discussion, and so as not to obscure the invention. A discussion of the example circuits and example timing diagrams will now follow.

FIG. 1 shows an example embodiment of the present invention. Other configurations and embodiments are also within the scope of the present invention. A processor 2 may be coupled with a data storage unit 6 (e.g., a cache memory) that contains desired data. A tag block 4 may also be coupled to the processor 2. The data storage unit 6 may be coupled to the circuit block 8 and the tag block 4 may be coupled to the circuit block 8. As will be described below, the circuit block 8 may asynchronously load data from the data storage unit 6 into a plurality of data buffers. The circuit block 8 may also synchronous read the data from the data buffers. The tag block 4 may provide the input signals (e.g. way hit signals) as discussed below that allows the asynchronous loading of data. A more detailed explanation will now follow.

Figure 2:
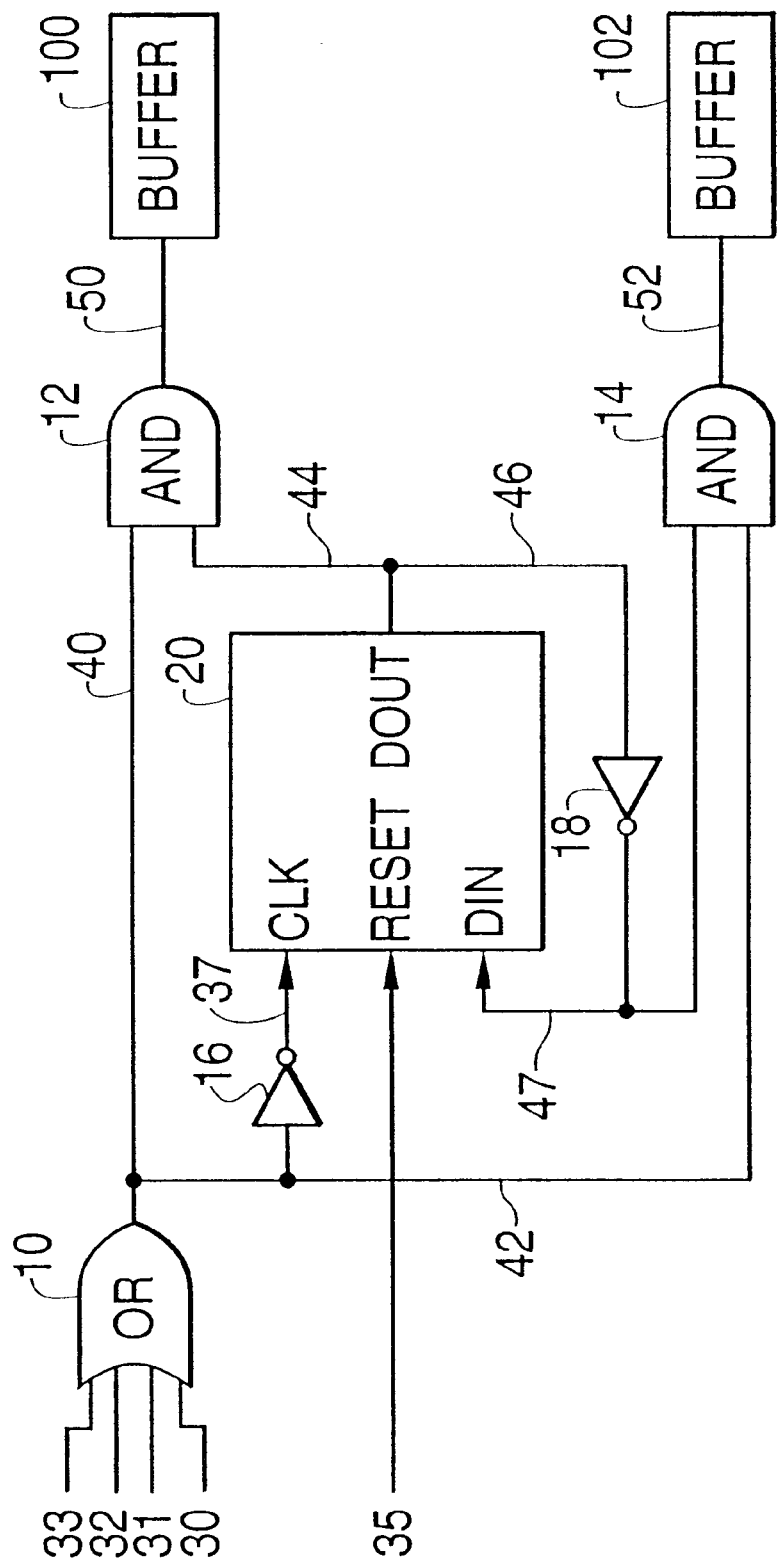
FIG. 2 is a diagram illustrating asynchronous loading of data into two data buffers according to an example embodiment of the present invention.

FIG. 2 shows an example embodiment of a circuit to perform the asynchronous loading of data into a first data buffer 100 and a second data buffer 102. This may be accomplished by the asynchronous timing of a latch enable signal 50 and a latch enable signal 52 that are coupled to the first data buffer 100 and the second data buffer 102, respectively. The asynchronous loading relates to the loading of data that is controlled by a signal that is not a synchronous clock signal, such as an external clock signal that may be applied to a microchip. As shown in FIG. 2, the input signals 30, 31, 32, and 33 are input to a logical OR circuit 10 and produce the asynchronous latch timing signal 40/42 based on a logical OR operation of the four input signals. The input signals 30, 31, 32, and 33 may correspond to way hits such as Way 0, Way 1, Way 2, and Way 3 signals (hereafter also called way signals). Each of the way signals may correspond to location of the data prior to its movement into the first data buffer 100 and the second data buffer 102. The latch timing signal 40 may be input to the logical AND circuit 12 and the latch timing signal 42 may be input to a logical AND circuit 14. The latch timing signal 40/42 may be input to an inverter circuit 16 that produces an asynchronous input signal 37 that is input to the clock input of a flip flop circuit 20 such as a master slave flip flop circuit. Accordingly, the input signal 37 is a complement of the latch timing signal 40/42. Because the input signal 37 is asynchronously provided, the flip flop circuit 20 will likewise operate asynchronously. The flip flop circuit 20 produces the pointer signal 44/46 in accordance with normal operations of a flip flop circuit. The master slave flip flop circuit 20 is merely an example state machine. Other state machines or different types of flip flop circuits may also be used in accordance with the present invention.

The pointer signal 44 is applied to an input of the logical AND circuit 12 and the pointer signal 46 is applied to an input of an inverter circuit 18 to produce a signal 47. The signal 47 is applied to the data input (DIN) of the flip flop circuit 20 and to an input of the logical AND circuit 14. A reset signal 35 may also be applied to a reset input of the flip flop circuit 20 so as to reset the flip flop circuit 20.

The logical AND circuit 12 produces the latch enable signal 50 by performing a logical AND operation on the asynchronous latch timing signal 40 and the pointer signal 44. The logical AND circuit 14 produces the latch enable signal 52 by performing a logical AND operation on the latch timing signal 42 and the signal 47. Data is latched into the data buffer 100 based on the latch enable signal 50 and data is latched into the data buffer 102 based on the latch enable signal 52.

In summary, FIG. 2 shows a circuit and method that asynchronously stores data in one of two data buffers 100 and 102 by using the input signals 30–33 to produce the latch timing signal 40/42 which in turn is used to create an asynchronous signal applied to the clock input of the flip flop circuit 20. The flip flop circuit 20 thereby produces the pointer signal 44/46. FIG. 2 shows one example embodiment of the present invention; however, other configurations and circuit designs are also within the scope of the present invention.

Figure 3:
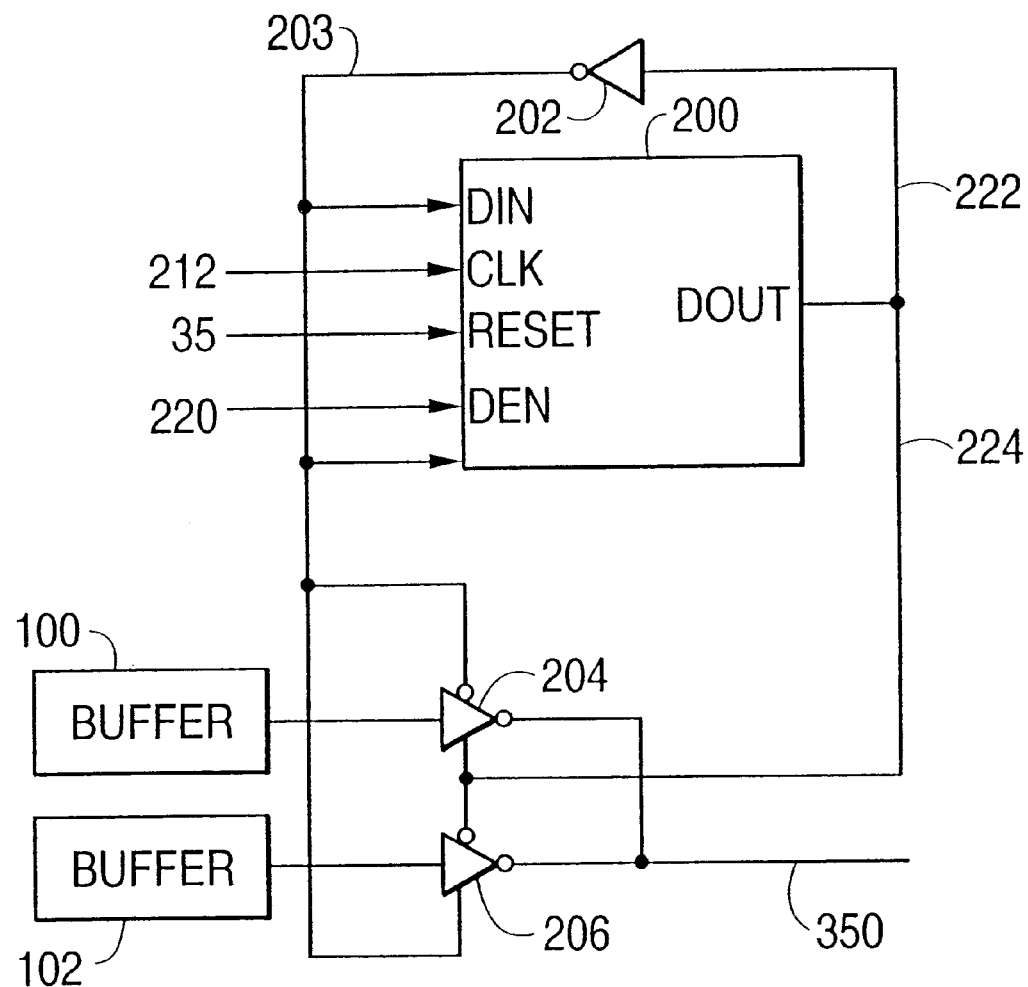
FIG. 3 is a diagram illustrating synchronous reading of data from two data buffers according to an example embodiment of the present invention.

FIG. 3 shows an example embodiment of a circuit to perform the synchronous reading of data from the data buffers 100 and 102. The first data buffer 100 is coupled to the input of a tristate inverter 204 and the second data buffer 102 is coupled to the input of a tristate inverter 206. Data may be read out as a read data signal 350 based on the state of the tristate inverters 204, 206. More specifically, FIG. 3 includes a flip flop circuit 200 such as a master slave flip flop circuit that receives a synchronous clock signal 212, the reset signal 35 and the data enable signal 220. The flip flop circuit 200 produces the pointer signal 222/224 in accordance with normal operations of a flip flop circuit. The master slave flip flop circuit 200 is merely an example state machine. Other state machines or different types of flip flop circuits may also be used in accordance with the present invention.

The pointer signal 222 may be applied to an input of an inverter circuit 202 that outputs the signal 203. The signal 203 is input to the DIN input of the flip flop circuit 200. The signal 203 may also be applied to the enable # input of the tristate inverter 204 and to the enable input of the tristate inverter 206. The pointer signal 224 may be applied to the enable input of the tristate inverter 204 and to the enable # input of the tristate inverter 206. The operation of a tristate inverter is well known. For example, when the enable # input is at a low voltage and the enable input is at a high voltage then the tristate inverter acts like an inverter. Otherwise, the tristate inverter does not drive the output. Based on the signal 203 and the pointer signal 224, data may be read out of the data buffer 100 or data may be read out of the data buffer 102 as the read data signal 350. The synchronous clock signal 212 applied to the flip flop circuit 200 controls the pointer signal 222/224 so that the data may be synchronously read from the data buffers 100 and 102. The synchronous clock signal 212 may be an internal clock that is produced by an on-chip phase lock loop. The phase lock loop may receive a ½ frequency external clock signal and produce a full frequency internal clock signal. Other types of clock signals are also within the scope of the present invention.

In summary, FIG. 3 shows a circuit and method that synchronously reads data from the data buffers 100 and 102 by using the synchronous clock signal 212 applied to the flip flop circuit 200 so as to produce the pointer signal 222/224. The pointer signal 224 is applied to the tristate inverters 204 and 206 to allow data to be read out from one of the data buffers 100 and 102. FIG. 3 shows one example embodiment of the present invention; however, other configurations and circuit designs are also within the scope of the present invention.

Figure 4:
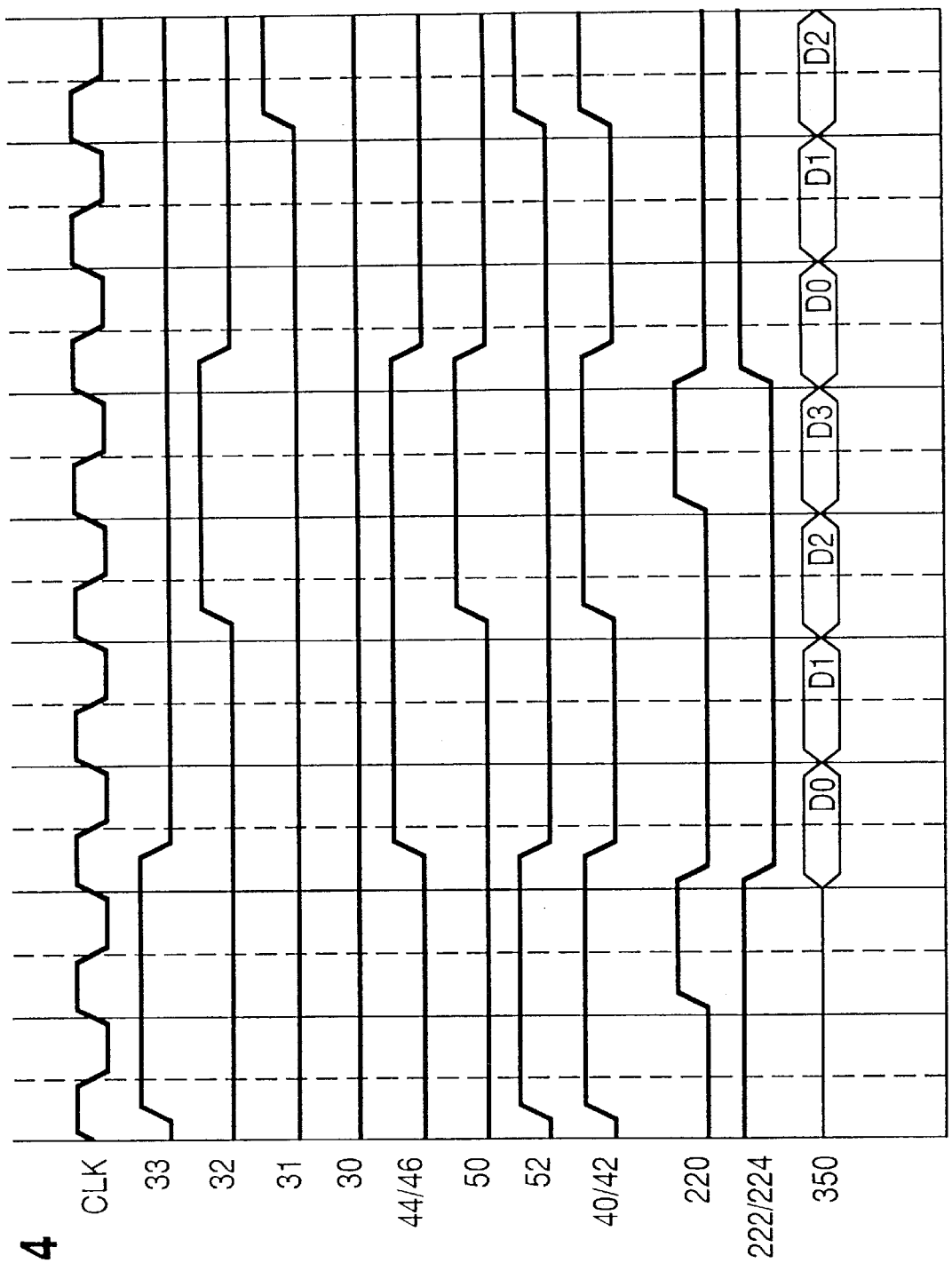
FIG. 4 is a timing chart of the signals shown in FIG. 2 and FIG. 3.

FIG. 4 shows a timing diagram of signals shown in FIG. 2 and FIG. 3. The timing of the signals is merely illustrative of the example embodiment and does not limit the scope of the present invention. That is, other timings of the signals are also within the scope of the present invention.

FIG. 4 shows the input signals 30, 31, 32 and 33 and how the logical OR circuit 10 produces the asynchronous latch timing signal 40/42. More specifically, the latch timing signal 40 goes high in response to the rising edge of the input signal 33. When the input signal 33 later changes from high to low, then the asynchronous latch timing signal 40142 also changes from high to low thereby causing the pointer signal 44/46 to change from low to high and causing the latch enable signal 52 to change from high to low. Subsequently, when the input signal 32 goes high, then the asynchronous latch timing signal 40/42 changes from low to high. The latch enable signal 50 then changes from low to high to enable data to be latched within the data buffer 100.

The synchronous reading of the data from the data buffers 100 and 102 is linked to the synchronous clock signal 212 that is applied to the clock input of the flip flop circuit 200. When the data enable signal 220 changes from high to low, then the pointer signal 222/224 also changes from high to low. This thereby enables data to be read from the data storage buffer 100. Subsequently, when the data enable signal 220 changes from a high to a low, then the pointer signal 222/224 changes from low to high to thereby enable data to be read from the other data storage buffer 102.

Data may be read from a data buffer either all at once or in chunks of data where each chunk is read in its entirety before the next chunk is read. For example, data within the data buffer 100 may be read as four chunks of data and data within the data buffer 102 may be read as four chunks of data. Each of the chunks D0, D1, D2 and D3 may be separately read from the data storage buffer 100 in succession as shown in FIG. 4. Similarly, each of the chunks D0, D1 and D2 may be separately read from the data storage buffer 102 in succession. The data enable signal 220 may corresponds to a last burst signal that indicates when the last chunk of a data buffer is being read. In other words, the data enable signal may go high when the last chunk D3 of data from a buffer is being read.

Figure 5:
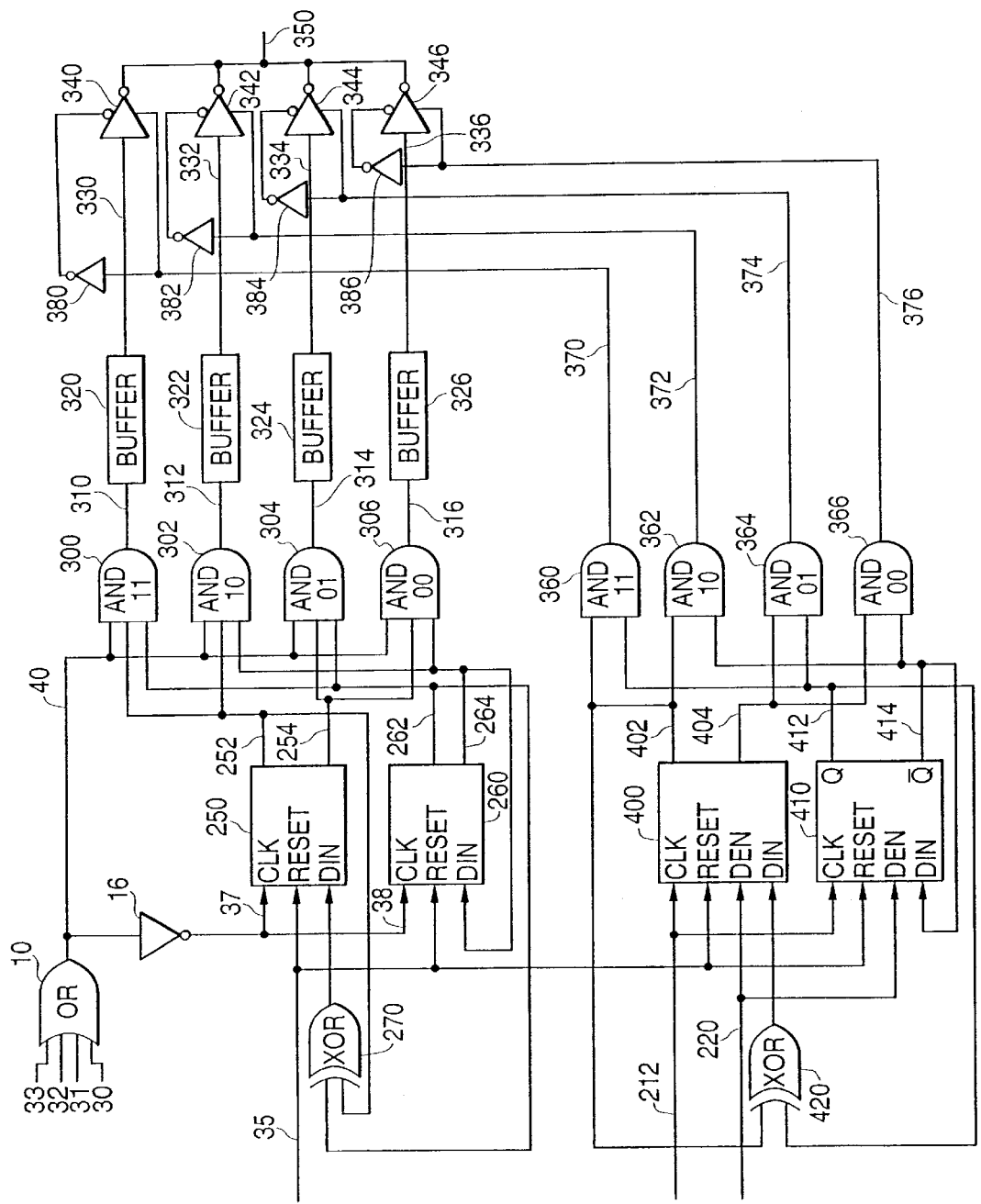
FIG. 5 is a diagram illustrating asynchronous loading of data into four data buffers and synchronous reading of data from four data buffers according to an example embodiment of the present invention.

FIG. 5 shows an example embodiment of a circuit to perform the asynchronous loading (writing) of data within four data buffers 320, 322, 324 and 326. This circuit may include a first flip flop circuit 250 and a second flip flop circuit 260 that operate in conjunction with the logical AND circuits 300, 302, 304 and 306 to produce the latch enable signals 310, 312, 314, and 316, respectively. The latch enable signals 310, 312, 314 and 316 enable data to be stored in the data buffers 320, 322, 324 and 326, respectively. The flip flop circuits 250 and 260 may be master slave type flip flop circuits or any other type of flip flop circuit or state machine.

In a similar manner to the FIG. 2 embodiment, the input signals 30, 31, 32 and 33 are applied to inputs of the logical OR circuit 10 that outputs the asynchronous latch timing signal 40 based on a logical OR operation. The asynchronous latch timing signal 40 is applied to an input of each of the logical AND circuits 300, 302, 304 and 306. The asynchronous latch timing signal 40 is also applied to an input of the inverter circuit 16 to produce the signals 37 and 38 that are applied to the clock input of the first flip flop circuit 250 and to the clock input of the second flip flop circuit 260. Thus, each of the first and second flip flop circuits 250 and 260 operates asynchronously based on the input signals 30-33.

Based on the asynchronous latch timing signal 40, the first flip flop circuit 250 may toggle between a first output signal 252 and its complement, a second output signal 254. The first output signal 252 may be applied to the input of the logical AND circuit 300 and to the input of the logical AND circuit 302. The second output signal 254 may be applied to the input of the logical AND circuit 304 and to the input of the logical AND circuit 306. Similarly, based on the asynchronous latch timing signal 40, the second flip flop circuit 260 may toggle between a first output signal 262 and its complement, a second output signal 264. The first output signal 262 may be applied to an input of the logical AND circuit 300 and to an input of the logical AND circuit 304. The second output signal 264 may be applied to an input of the logical AND circuit 302 and to an input of the logical AND circuit 306. Each of the logical AND circuits 300, 302, 304 and 306 performs a logical AND operation based on its three input signals to produce the latch enable signals 310, 312, 314 and 316, respectively. Accordingly, based on the asynchronous latch timing signal 40 applied to the input of the logical AND circuits, one of the latch enable signals 310, 312, 314 and 316 will enable data to be stored in its respective data buffer 320, 322, 324 and 326.

The first output signal 252 is also applied to an input of the logical exclusive OR circuit 270. The first output signal 262 is applied to another input of the logical exclusive OR circuit 27C. The logical exclusive OR circuit 270 performs a logical exclusive OR operation on the two input signals to output a signal to the DIN input of the flip flop circuit 250. The second output signal 264 is applied to a DIN input of the second flip flop circuit 260. The signal 220 is applied to the data enable input (DEN) of the flip flop circuits 400 and 410.

In addition to the above-described arrangement for asynchronous writing, FIG. 5 also shows an example embodiment of a circuit to perform the synchronous reading of data from the four data buffers 320, 322, 324 and 326. This circuit may include the third flip flop circuit 400, the fourth flip flop circuit 410, the logical AND circuits 360, 362, 364 arid 366 and the logical exclusive OR circuit 420. The flip flop circuits 400 and 410 may be master slave type flip flop circuits or any other type of flip flop circuit or state machine. A synchronous clock signal 212 may be applied to the clock input of the third flip flop circuit 400 and to the clock input of the fourth flip flop circuit 410. The third flip flop circuit 400 may produce a first output signal 402 and its complement, a second output signal 404, based on the synchronous clock signal 212. The fourth flip flop circuit 410 may produce a first output signal 412 and its complement, a second output signal 414, based on the synchronous clock signal 212.

The first output signal 402 is applied to an input of the logical AND circuit 360 and to an input of the logical AND circuit 362. The second output signal 404 is applied to an input of the logical AND circuit 364 and to an input of the logical AND circuit 366. The first output signal 412 is applied to an input of the logical AND circuit 360 and to an input of the logical AND circuit 364. The second output signal 414 is applied to an input of the logical AND circuit 362 and to an input of the logical AND circuit 366. Each of the logical AND circuits 360, 362, 364 and 366 performs a logical AND operation based on its two input signals to produce the select signals 370, 372, 374, and 376, respectively. The select signals 370, 372, 374 and 376 are used to read out data from the data buffers 320, 322, 324 and 326, respectively.

The first output signal 402 is applied to an input of the logical exclusive OR circuit 420. The first output signal 412 is applied to another input of the logical exclusive OR circuit 420. The logical exclusive OR circuit 420 performs a logical exclusive OR operation on the two input signals to output a signal to the DIN input of the flip flop circuit 400. The second output signal 414 is applied to a DIN input of the second flip flop circuit 410.

The select signal 370 is applied to the enable input of a tristate inverter 340. The select signal 370 is also applied through an inverter circuit 380 to the enable # input of the tristate inverter 340. The select signal 372 is applied to the enable input of a tristate inverter 342. The select signal 372 is also applied trough the inverter circuit 382 to the enable # input of the tristate inverter 342. The select signal 374 is applied to the enable input of the tristate inverter 344. The select signal 374 is also applied through the inverter circuit 384 to the enable # input of the tristate inverter 344. The select signal 376 is applied to the enable input of the tristate inverter 346. The select signal 376 is also applied through the inverter circuit 386 to the enable # input of the tristate e inverter 346.

The output 330 of the data buffer 320 is connected to an input of the tristate inverter 340, the output 332 of the data buffer 322 is connected to an input of the tristate inverter 342, the output 334 of the data buffer 324 is connected to an input of the tristate inverter 344 and the output 336 of the data buffer 326 is connected to an input of the tristate inverter 346. Based on the respective select signals 370, 372, 374 and 376, the tristate inverters 340, 342, 344 and 346 may act as switches to allow data from a respective one of the data buffers 320, 322, 324 and 326 to be output as the read data signal 350. The circuit shown in FIG. 5 allows data to be synchronously read out from the data buffers 320, 322, 324 and 326 on outputs 330, 332, 334 and 336 based on the synchronous clock signal 212 applied to the clock inputs of the third and fourth flip flop circuits 400 and 410. FIG. 5 shows one example embodiment of the present invention; however, other configurations and circuit designs are also within the scope of the present invention.

Figure 6:
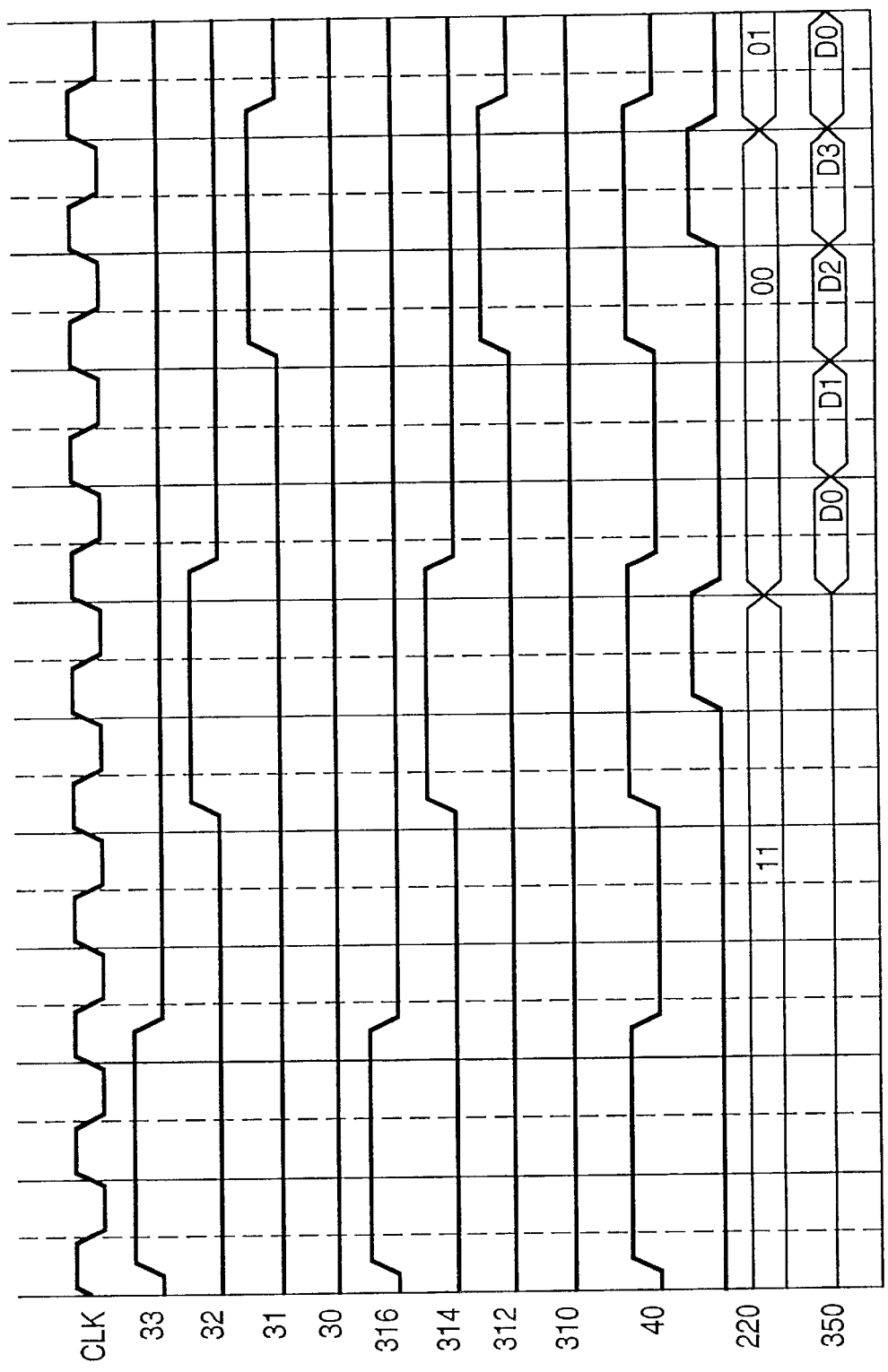
FIG. 6 is a timing chart of the signals shown in FIG. 5.

FIG. 6 shows a timing diagram of signals shown in FIG. 5. More specifically, the input signals 30, 31, 32 and 33 are used to produce the latch enable signals 310, 312, 314 and 316 which in turn enable the data to be latched into a respective one of the data buffers 320, 322, 324 and 326. The synchronous clock signal 212 and the data enable signal 220 may control the data read from the data buffers 320, 322, 324 and 326 along outputs 330, 332, 334 and 336 and out of the circuit as the read data signal 350.

In a similar manner as described above, the data may be read from the data buffers in chunks of data such as D0, D1, D2 and D3. FIG. 6 shows the chunks of data D0, D1, D2 and D3 being read from the data buffer 326. While FIG. 6 only shows the data being read from the data buffer 326 and the beginning of the data being read from the data buffer 324, it is understood that this timing diagram may be extended to reference all of the data buffers.

FIGS. 5 and 6 show how an asynchronous latch timing signal 40 may be used to produce latch enable signals, which in turn control the data buffer into which data may be stored. A synchronous clock signal 212 may be used to produce the select signals 360, 362, 364 and 366 to read data out from the respective data buffers.

FIG. 7A is a flowchart showing one embodiment of asynchronously loading data into two data buffers. FIG. 7B is a flowchart showing one embodiment of synchronous reading of data from two data buffers. These flowcharts illustrate an example embodiment and are not meant to limit the present invention. That is, other embodiments and methods are within the scope of the present invention.

In block 402 of FIG. 7A, a plurality of signals are input. A timing signal is created in block 404 as discussed above. The timing signal may correspond to either the first data buffer or the second data buffer. If the timing signal corresponds to the first data buffer, then the first latch enable signal is output in block 406 causing data to be stored in the first data buffer (block 408). On the other hand, if the timing signal corresponds with the second data buffer, then the second latch enable signal is output in block 410 causing data to be stored in the second data buffer (block 412). After storing the data in either the first data buffer or the second data buffer, operations may return back to block 402 to repeat the respective blocks. It is understood that this flowchart may be continuous as the timing signal may continuously alternate between the first latch enable signal and the second latch enable signal as discussed above.

FIG. 7B shows the synchronous reading of the data from the first data buffer and the second data buffer based a pointer signal. In particular, the synchronous clock signal may be received in block 500. A pointer signal may be output in block 502 based on the synchronous clock signal. This pointer signal may correspond to data in the first data buffer or in the second data buffer. More particularly, if the pointer signal corresponds to the first data buffer, then data may be read from the first data buffer based on the pointer signal (block 504). Alternatively, if the pointer signal corresponds to the second data buffer, then data may be read from the second data buffer based on the pointer signal (block 506). After reading data from the data buffers, operations may repeat back to blocks 500 and 502 to repeat the outputting of the pointer signal. It is understood that the pointer signal may be continuously changing to alternate between the first data buffer and the second data buffer.

Embodiments of the present invention allow any number of data latency cycles while maintaining the data latching and the data sequencing without giving up timing margins to synchronous latching.

In summary, the present invention is directed to arrangements (e.g., circuits, apparatus, methods, systems) for effecting an interleaved storage of data where a first arrangement receives a plurality of input signals and outputs a timing signal based on the input signals; and a second arrangement receives the timing signal and outputs a first enable signal and a second enable signal based on the timing signal. The first enable signal enables data to be stored in a first data buffer and the second enable signal enables data to be stored in a second data buffer. All enable signals are mutually exclusive of one another so as to effect interleaving of differing data positions into differing buffers. The present invention may also be directed to arrangements for effecting an interleaved reading of data.

Embodiments of the present invention provide unique advantages such as allowing the latching the data to not be limited by a synchronous clock signal. Embodiments of the present invention also allow use of multiple storage buffers that are used for higher data latencies and to load these data storage buffers asynchronously so that the timing margin is not lost waiting to synchronize with a clock. Accordingly, as microprocessor frequencies continue to rise, then the cache latencies will also rise in accordance with embodiments of the present invention.

While the invention has been described with reference to specific embodiments, the description of the specific embodiments is illustrative only and is not to be construed as limiting the scope of the invention. Various other modifications and changes may occur to those skilled in the art without departing from the spirit and scope of the invention. In particular, while the figures and description discuss circuits, the present invention also covers other circuit designs, fabrications, microchips having circuit designs and software or media containing the functional equivalent of these circuits, circuit designs and fabrications.

What is claimed is:

1. A circuit comprising:
    an asynchronous load circuit to receive a plurality of input signals and to asynchronously load data from a cache memory into a first data buffer and a second data buffer; and
    a synchronous read circuit, coupled t said first data buffer and said second data buffer, to synchronously read said data from said first data buffer and said second data buffer.

2. The circuit of claim 1, wherein said asynchronous load circuit is to create a timing signal based on said pluraliy of input signals, said timing signal used to create a first enable signal and a second enable signal, said first enable signal to enable data to be stored in said first data buffer, and said second enabling signal to enable data to be stored in said second data buffer.

3. The circuit of claim 1, wherein said asynchronous read circuit is to read said data from said first data buffer and said second data buffer based on a synchronous signal to be applied to said synchronous read circuit.

4. The circuit of claim 1, wherein each of said plurality of input signals corresponds to a location of said data in said cache memory.

5. A circuit comprising:
a first circuit portion to receive a plurality of input signals and to output a timing signal based on said input signals; and
a second circuit portion to receive said timing signal and to asynchronously output a first latch enable signal and a second latch enable signal based on said timing signal, said first latch enable signal to enable data to be stored in a first data buffer and said second latch enable signal to enable data to be stored in a second data buffer.

6. The circuit of claim 5, wherein said first circuit portion comprises a logical OR circuit that receives said plurality of input signals and performs is a logic OR operation on said plurality of input signals to produce said timing signal.

7. The circuit of claim 5, wherein said second circuit portion comprises:
a flip/flop circuit to receive an asynchronous signal as a clock input to said flip flop circuit, said asynchronous signal being based on said timing signal, said flip/flop circuit to output a pointer signal;
a first logical AND circuit to receive said timing signal and said pointer signal and to perform a logical AND operation to output said first latch enable signal; and
a second logical AND circuit to receives aid timing signal and a complement of said pointer signal and to perform a logical AND operation to output said second latch enable signal.

8. The circuit of claim 5, wherein each of the plurality of input signals corresponds to a location of said data in a cache memory.

9. The circuit of claim 5, further comprising a third circuit portion coupled to the first data buffer and the second data buffer, said third circuit portion to address said first data buffer and said second data buffer so as to read said data from said first data buffer and said second data buffer based on a synchronous signal to be applied to said third circuit portion.

10. A circuit for asynchronously loading data in a first data buffer and a second data buffer and synchronously reading data from said first data buffer and said second data buffer, the circuit comprising:
a load data circuit to receive a plurality of input signals and to output a first latch enable signal and a second latch enable signal, said load data circuit to asynchronously operate based on said input signals, said first latch enable signal to enable data to be loaded into said first data buffer and said second latch enable signal to enable data to be loaded into said second data buffer; and
a read data circuit coupled to said first data buffer and said second data buffer, said read data circuit to address said first data buffer and said second data buffer so as to read said data from said first data buffer and said second data buffer based on a synchronous signal applied to said read data circuit.

11. The circuit of claim 10, wherein each of said plurality of input signals corresponds to a location of said data in a cache memory.

12. The circuit of claim 10, wherein said read data circuit comprises:
a flip/flop circuit to receive a synchronous signal at a clock input of said flip/flop circuit, said flip/flop circuit to output a pointer signal; and
an addressing circuit coupled to both said first data buffer and said second data buffer, said addressing circuit to receive said pointer signal and to output data from one of said first data buffer and said second data buffer at least based on said pointer signal.

13. The circuit of claim 10, wherein the load data circuit comprises a logical OR circuit to receive said plurality of input signals and perform a logical OR operation on said plurality of input signals to produce a timing signal.

14. The circuit of claim 13, wherein said load data circuit further comprises:
a flip/flop circuit to receive an asynchronous signal as a clock input to said flip/flop circuit, said asynchronous signal being based on said timing signal, said flip/flop circuit to output a pointer signal;
a first logical AND circuit to receive said timing signal and said pointer signal and to perform a logical AND operation to output said first latch enable signal; and
a second logical AND circuit to receive said timing signal and said pointer signal and perform a logical AND operation to output said second latch enable signal.

15. The circuit of claim 13, wherein said load data circuit comprises:
a first flip/flop circuit to receive an asynchronous signal as a clock input to said first flip/flop circuit, said asynchronous signal being based on said timing signal, said first flip/flop circuit to output a first output signal and a second output signal;
a second flip/flop circuit to receive said asynchronous signal as a clock input to said second flip/flop circuit, said second flip/flop circuit to output a third output signal and a fourth output signal;
a first logical AND circuit to receive said first output signal, said third output signal and said timing signal and to perform a logical AND operation to output said first latch enable signal;
a second logical AND circuit to receive said second output signal, said fourth output signal and said timing signal and to perform a logical AND operation to output said second latch enable signal;
a third logical AND circuit to receive said first output signal, said fourth output signal and said timing signal and to perform a logical AND operation to output a third latch enable signal, said third latch enable signal to enable data to be stored in a third data buffer; and
a fourth logical AND circuit to receive said second output signal, said fourth output signal and said timing signal and perform a logical AND operation to output a fourth latch enable signal, said fourth latch enable signal to enable data to be stored in a fourth data buffer.

16. The circuit of claim 15, wherein said read data circuit comprises:
a third flip/flop circuit to receive a synchronous signal as a clock input of said third flip/flop circuit and to output a fifth output signal and a sixth output signal;
a fourth flip/flop circuit to receive said synchronous clock signal as a clock input of said fourth flip/flop circuit and to output a seventh output signal and an eighth output signal;
a first logical AND circuit to receive said fifth output signal and said seventh output signal and to perform a logical AND operation to output a first select signal;

a second logical AND circuit to receive said fifth output signal and said eighth output signal and to perform a logical AND operation to output a second select signal;

a third logical AND circuit to receive said sixth output signal and said seventh output signal and to perform a logical AND operation to output a third select signal; and a fourth logical AND circuit to receive said sixth output signal and said eighth output signal and to perform a logical AND operation to output a fourth select signal.

17. The circuit of claim 16, wherein said read data circuit is to output said data from said first data buffer based on said first select signal, is to output said data from said third data buffer based on said second select signal, is to output said data from said second data buffer based on said third select signal and is to output said data from said fourth data buffer based on said fourth select signal.

18. A method of asynchronously loading data into a plurality of data buffers and synchronously reading said data from said plurality of buffers, said method comprising:

inputting a plurality of input signals;

asynchronously outputting a first latch enable signal allowing data to be loaded into a first data buffer and asynchronously outputting a second latch enable signal allowing data to be loaded into a second data buffer, said first latch enable signal and said second latch enable signal being based on said plurality of input signals;

receiving a synchronous signal; and reading data from said first data buffer and said second buffer based on said synchronous signal.

19. The method of claim 18, further comprising creating a timing signal based on said input signals, and wherein said first latch enable signal and said second latch enable signal are output based on said timing signal.

20. The method of claim 18, wherein said synchronous signal is applied to a clock input of a flip/flop circuit, said flip/flop circuit outputting a pointer signal based on said synchronous signal, said pointer signal used to read data from said first data buffer and said second data buffer.

21. The method of claim 18, wherein each of said input signals corresponds to a location of said data in a cache memory.

22. A system for loading data and reading data comprising:

a first data storage unit;

a second data storage unit; and a circuit to asynchronously load data into said first data storage unit and said second data storage unit and to synchronously read data from said first data storage unit and said second data storage unit, said circuit comprising:

a load data circuit to receive a plurality of input signals and to output a first latch enable signal and a second latch enable signal, said load data circuit to asynchronously operate based on said input signals, wherein said first latch enable signal is to enable data to be loaded into said first data storage unit and said second latch enable signal is to enable data to be loaded into said second data storage unit; and a read data circuit coupled to said first data storage unit and said second data storage unit, said read data circuit to address said first data storage unit and said second data storage unit so as to read said data from said first data storage unit and said second data storage unit based on a synchronous signal applied to said read data circuit.

23. The system of claim 22, wherein each of said plurality of input signals corresponds to a location of said data in a cache memory.

24. The system of claim 22, wherein said read data circuit comprises:

a flip/flop circuit to receive a synchronous signal at a clock input of said flip/flop circuit flip/flop circuit outputting a pointer signal; and an addressing circuit coupled to both said first data storage unit and said second data storage unit, said addressing circuit to receive said pointer signal and to output data from one of said first data storage unit and said second data storage unit at least based on said pointer signal.

25. The system of claim 22, wherein the load data circuit comprises a logical OR circuit to receive said plurality of input signals and to perform a logical OR operation on said plurality of input signals to produce a timing signal.

26. The system of claim 25, wherein said load data circuit further comprises:

a flip/flop circuit to receive an asynchronous signal as a clock input of said flip/flop circuit, said asynchronous signal being based on said timing signal, said flip/flop circuit to output a pointer signal;

a first logical AND circuit to receive said timing signal and said pointer signal and to perform a logical AND operation to output said first latch enable signal; and a second logical AND circuit to receive said timing signal and said pointer signal and to perform a logical AND operation to output said second latch enable signal.

* * * * *